United States Patent
Roth et al.

(10) Patent No.: US 12,052,033 B2
(45) Date of Patent: Jul. 30, 2024

(54) SCHEDULING OF ITERATIVE DECODING DEPENDING ON SOFT INPUTS

(71) Applicant: Apple Inc., Cupertino, CA (US)

(72) Inventors: Roy Roth, Tel Aviv (IL); Yonathan Tate, Kfar Saba (IL)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 17/863,425

(22) Filed: Jul. 13, 2022

(65) Prior Publication Data

US 2024/0022262 A1    Jan. 18, 2024

(51) Int. Cl.
*H03M 13/11* (2006.01)
*H03M 13/29* (2006.01)
*H03M 13/43* (2006.01)

(52) U.S. Cl.
CPC .... *H03M 13/1131* (2013.01); *H03M 13/1134* (2013.01); *H03M 13/1137* (2013.01); *H03M 13/1108* (2013.01); *H03M 13/2948* (2013.01); *H03M 13/43* (2013.01)

(58) Field of Classification Search
CPC ......... H03M 13/1131; H03M 13/1134; H03M 13/1137
See application file for complete search history.

(56) References Cited

U.S. PATENT DOCUMENTS

| | | | |
|---|---|---|---|
| 6,647,462 B1 | 11/2003 | Miretsky et al. | |
| 8,140,948 B2 | 3/2012 | Yue et al. | |
| 8,209,579 B2 | 6/2012 | Belogolovy | |
| 8,352,827 B2 | 1/2013 | Gong et al. | |
| 8,739,004 B2 | 5/2014 | Olcay et al. | |
| 8,782,487 B2 | 7/2014 | Yang et al. | |

(Continued)

FOREIGN PATENT DOCUMENTS

| | | |
|---|---|---|
| CN | 103281090 A | 9/2013 |
| WO | 2015139160 A1 | 9/2015 |

OTHER PUBLICATIONS

Beermann et al., "A Generalization of Residual Belief Propagation for Flexible Reduced Complexity LDPC Decoding", Institute of Communication Systems and Data Processing, pp. 1-5, Sep. 2011.

(Continued)

*Primary Examiner* — Joseph D Torres
(74) *Attorney, Agent, or Firm* — KLIGLER & ASSOCIATES PATENT ATTORNEYS LTD.

(57) ABSTRACT

A decoder includes circuitry and multiple Variable-Node Circuits (VNCs). The VNCs individually hold one or more variables of an Error Correction Code (ECC) that is representable by a plurality of check equations defined over the variables. The circuitry is configured to receive a code word including variables having m-bit values that was encoded using the ECC, to further receive reliability levels assigned respectively to the variables, to decode the code word by applying to the code word a sequence of iterations, including deciding in a given iteration whether a given VNC is to be processed or skipped in that iteration, depending on the reliability levels assigned to the variables of the given VNC, and, when the given VNC is selected for processing, to make a decision whether or not to update one or more of the variables of the given VNC, and to apply the decision by the given VNC.

18 Claims, 4 Drawing Sheets

(56) References Cited

U.S. PATENT DOCUMENTS

| | | | |
|---|---|---|---|
| 9,258,015 B2 | 2/2016 | Ish-Shalom et al. | |
| 9,270,297 B2 | 2/2016 | Sharon et al. | |
| 9,337,955 B2 | 5/2016 | Anholt et al. | |
| 9,755,665 B1* | 9/2017 | Chilappagari | H03M 13/1105 |
| 10,038,456 B1* | 7/2018 | Nguyen | H03M 13/3746 |
| 10,164,656 B2 | 12/2018 | Yang et al. | |
| 10,298,262 B2 | 5/2019 | Winstead et al. | |
| 10,389,388 B2 | 8/2019 | Tate et al. | |
| 2005/0257124 A1* | 11/2005 | Richardson | H03M 13/1145 |
| | | | 714/796 |
| 2005/0262420 A1* | 11/2005 | Park | H03M 13/1137 |
| | | | 714/758 |
| 2006/0061498 A1 | 3/2006 | Lamy | |
| 2008/0148128 A1* | 6/2008 | Sharon | H03M 13/114 |
| | | | 714/780 |
| 2008/0256264 A1 | 10/2008 | Muto et al. | |
| 2010/0262813 A1 | 10/2010 | Brown et al. | |
| 2011/0246862 A1 | 10/2011 | Graef | |
| 2012/0036410 A1* | 2/2012 | Rault | H03M 13/6544 |
| | | | 714/752 |
| 2012/0106683 A1 | 5/2012 | Zhao | |
| 2015/0180511 A1* | 6/2015 | Ish-Shalom | H03M 13/1111 |
| | | | 714/776 |
| 2015/0381206 A1 | 12/2015 | Fainzilber et al. | |
| 2016/0182087 A1 | 6/2016 | Sommer et al. | |
| 2017/0117925 A1 | 4/2017 | Achtenberg et al. | |
| 2017/0272102 A1 | 9/2017 | Goldenberg et al. | |
| 2019/0207630 A1* | 7/2019 | Tate | H03M 13/1131 |
| 2020/0235753 A1* | 7/2020 | Viterbo | H03M 13/6502 |
| 2021/0250045 A1 | 8/2021 | Ha et al. | |

OTHER PUBLICATIONS

Sharon et al., "An Efficient Message-Passing Schedule for LDPC Decoding", Proceedings of 23rd IEEE Convention of Electrical and Electronics Engineers in Israel, pp. 1-4, Sep. 2004.

Sharon et al., "Convergence Analysis of Serial Message-Passing Schedules for LDPC Decoding", 4th International Symposium on Turbo Codes & Related Topics; 6th International ITG-Conference on Source and Channel Coding, pp. 1-6, Apr. 3-7, 2006.

Sharon et al., "Efficient Serial Message-Passing Schedules for LDPC Decoding", IEEE Transactions on Information Theory, vol. 53, No. 11, pp. 4076-4091, Nov. 2007.

Radosavljevic et al., "Optimized Message Passing Schedules for LDPC Decoding", Conference Record of the Thirty-Ninth Asilomar Conference on Signals, Systems and Computers, pp. 591-595, Oct. 30-Nov. 2, 2005.

Ghaffari et al., "Probabilistic Gradient Descent Bit-Flipping Decoders for Flash Memory Channels," 2018 IEEE International Symposium on Circuits and Systems (ISCAS), pp. 1-5, year 2018.

Ivanis et al., "Fault Tolerant Decoders," Conference Paper, Tinkos 2014, pp. 1-33, year 2014.

Wadayama et al., "Gradient Descent Bit Flipping Algorithms for Decoding LDPC Codes," IEEE Transactions on Communications, vol. 58, No. 6, pp. 1610-1614, Jun. 2010.

Cui et al., "Efficient Decoder Design for High-Throughput LDPC Decoding," IEEE Xplore, pp. 1640-1643, year 2008.

Psota et al., "The Manifestation of Stopping Sets and Absorbing Sets as Deviations on the Computation Trees of LDPC Codes," Journal of Electrical and Computer Engineering, vol. 2010, article ID 432495, pp. 1-17, year 2010.

Aslam et al., "Edge-Based Dynamic Scheduling for Belief-Propagation Decoding of LDPC and RS Codes," IEEE Transactions on Communications, vol. 65, No. 2, pp. 525-535, Feb. 2017.

* cited by examiner

SCHEDULING OF ITERATIVE DECODING DEPENDING ON SOFT INPUTS

TECHNICAL FIELD

Embodiments described herein relate generally to Error Correction Coding (ECC), and particularly to methods and systems for ECC decoding.

BACKGROUND

Some types of error correction codes, such as Low Density Parity Check (LDPC) codes, are commonly decoded using iterative decoding processes. The intra-order of operations that are performed during decoding iterations is referred to as scheduling.

Various scheduling schemes and configurations for iterative decoding are known in the art. For example, U.S. Pat. No. 10,389,388 describes a decoder that includes multiple variable-node circuits and logic circuitry. The variable-node circuits hold variables of an Error Correction Code (ECC), defined by a set of check equations over multiple variables corresponding to the variable-node circuits. The logic circuitry is configured to receive a code word encoded using the ECC, to hold, prior to decoding in a sequence of iterations, a scheduling scheme that specifies, for each iteration, whether each of the variable-node circuits is to be processed or skipped in that iteration, to perform the iterations in the sequence, including selecting for processing, in each iteration, only variable-node circuits specified for processing in that iteration, to determine for each selected variable-node circuit, a count of unsatisfied check equations in which the respective variable participates, and to make a decision on flipping a binary value of the variable based on the count and apply the decision by the respective variable-node circuit.

SUMMARY

An embodiment that is described herein provides a decoder that includes logic circuitry and multiple Variable-Node Circuits (VNCs). The VNCs are configured to individually hold one or more variables of an Error Correction Code (ECC) that is representable by a plurality of check equations defined over the variables. The logic circuitry is configured to receive for decoding a code word that was encoded using the ECC, the code word including multiple variables having m-bit values, m being a positive integer, to further receive multiple reliability levels assigned respectively to the variables of the received code word, to decode the received code word by applying to the code word a sequence of iterations, including deciding in a given iteration in the sequence whether a given VNC among the VNCs is to be processed or skipped in that iteration, depending on the reliability levels assigned to the variables associated with the given VNC, and, when the given VNC is selected for processing, to make a decision whether or not to update one or more of the values of the variables associated with the given VNC, and to apply the decision by the given VNC.

In some embodiments, prior to performing the sequence of iterations, the logic circuitry is configured to derive, based at least on the reliability levels, a schedule specifying which of the VNCs are to be processed and which of the VNCs are to be skipped in one or more of the iterations, and to decide to process or skip the VNCs during performing the iterations based on the derived schedule. In other embodiments, the values of the reliability levels belong to a set of two or more predefined reliability values, and the logic circuitry is configured to determine counts of the variables in the given VNC that are assigned respectively to the two or more reliability values, and to decide to process or skip the given VNC based at least on the counts. In yet other embodiments, the logic circuitry is configured to decide to process or skip the given VNC depending at least on a number of the variables in the given VNC that are assigned to a lowest reliability value among the predefined reliability values.

In an embodiment, the predefined reliability values include binary values having a High Reliability (HR) value and a Low Reliability (LR) value, and the logic circuitry is configured to hold, for a given iteration among the iterations, predefined first and second skipping thresholds associated respectively with the LR and the HR values, to evaluate a number of the variables in the given VNC assigned to the LR value, and to decide to skip the given VNC based on the first skipping threshold when the evaluated number is higher than a predefined threshold number, or based on the second skipping threshold when the evaluated number is lower than or equal to the predefined threshold number. In another embodiment, the variables of the code word having binary values, the values of the reliability levels belong to a set of two or more predefined reliability values, and the logic circuitry is configured to calculate a score value for a given variable of the given VNC, based at least on the reliability level assigned to the given variable, the score value being indicative of a confidence level of the given variable holding a correct binary value corresponding to a successfully decoded version of the code word, and to make the decision for the given variable based on the score value. In yet another embodiment, the logic circuitry is configured to select a bit-flipping threshold from among multiple predefined bit-flipping thresholds associated respectively with the predefined reliability values, depending on the reliability level assigned to the given variable, and to make the decision to update the value of the given variable by flipping the binary value of the given variable when the score value calculated for the given variable exceeds the selected bit-flipping threshold.

In some embodiments, the logic circuitry is configured to calculate the score value for the given variable based on (i) a number of the check equations of the ECC in which the given variable participates and that are unsatisfied, (ii) an indication of whether the binary value of the given variable differs from a corresponding binary value in the received code word, and (iii) a predefined weight value applied to the indication, the weight value depending on the reliability level assigned to the given variable. In other embodiments, the ECC including a Low-Density Parity-Check (LDPC) code, in which the parity-check matrix including multiple sub-matrices arranged in block-rows and block-columns, and the variables of the given VNC are (i) associated with a respective block-column of the parity-check matrix, and (ii) participate in a common number of check equations among the plurality of the check equations. In yet other embodiments, the logic circuitry is configured to make the decision for at least two of the variables associated with the given VNC, in parallel to one another.

In an embodiment, the circuitry is configured to decide that the given VNC is to be skipped in a subsequence of one or more initial iterations of the sequence of iterations.

There is additionally provided, in accordance with an embodiment that is described herein, a method for decoding, including, in a decoder that includes multiple Variable-Node Circuits (VNCs) that individually hold one or more variables of an Error Correction Code (ECC) that is representable by a plurality of check equations defined over the variables, receiving for decoding a code word that was encoded using the ECC, the code word including multiple variables having m-bit values, and further receiving multiple reliability levels assigned respectively to the variables of the received code word. The received code word is decoded by applying to the code word a sequence of iterations, including deciding in a given iteration in the sequence whether a given VNC among the VNCs is to be processed or skipped in that iteration, depending on the reliability levels assigned to the variables associated with the given VNC. When the given VNC is selected for processing, a decision is made whether or not to update one or more of the values of the variables associated with the given VNC, and the decision is applied by the given VNC.

These and other embodiments will be more fully understood from the following detailed description of the embodiments thereof, taken together with the drawings in which:

DETAILED DESCRIPTION OF EMBODIMENTS

Overview

Figure 1:
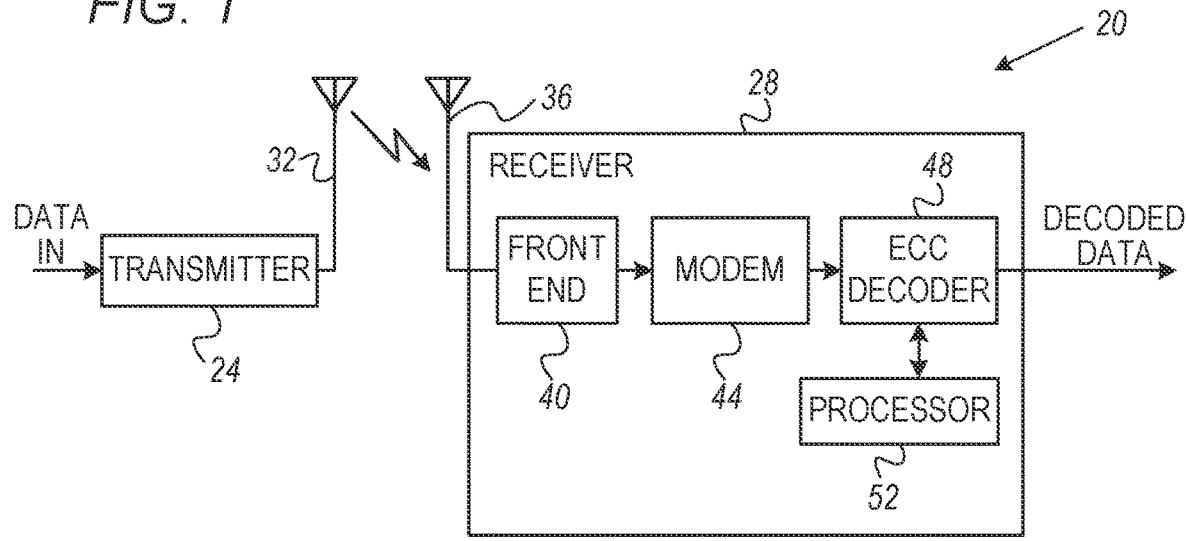
FIG. 1 is a block diagram that schematically illustrates a communication system that uses Error Correction Coding (ECC), in accordance with an embodiment that is described herein.

Some types of ECC, such as Low Density Parity Check (LDPC) codes, may be represented by multiple check equations that are defined over multiple variables. Some iterative ECC decoders may be represented using multiple check nodes corresponding to the check equations, and multiple variable nodes corresponding to the variables. In this representation, the variable node corresponding to a given variable is connected to the check nodes that correspond to the check equations in which the given variable appears.

A decoder for codes of this sort, can be implemented as a message passing decoder, which decodes the ECC by exchanging messages between check nodes and variable nodes that are connected to one another, in an attempt to converge to a state in which the variables corresponding to the variable nodes hold a valid code word of the ECC. The decoder converges to a valid code word when all the check equations representing the ECC are satisfied by the current values of the variables. The number of check equations in which a given variable appears is also referred to as the degree of that variable. Prior to decoding convergence, it is possible that for a given variable, only a partial subset of the check equations in which that variable appears are satisfied.

The ECC decoder may attempt converging to a valid code word by executing multiple decoding iterations. In the context of the present disclosure and in the claims, the term iteration refers to a scan over the entire check nodes and variable nodes, wherein one or more of the scanned variable nodes may be skipped.

Embodiments that are described herein provide improved methods and systems for scheduling the computations carried out by the check and variable nodes during the decoding iterations, wherein the scheduling depends on reliability levels assigned to bits of the input code word to be decoded. In the context of the present disclosure, the term "scheduling" refers to the scanning order of the check and variable nodes, including parameters specified for handling this order such as, for example, skipping thresholds and bit-flipping thresholds. In the presented embodiments, scheduling of the variable nodes mainly refers to "serial V" scheduling, in which the variable nodes (or groups thereof) are scanned sequentially.

In the disclosed embodiments, a code word to be decoded is accompanied with reliability levels assigned to the bits of the code word. Based on the reliability levels, certain variable nodes, or groups of variable nodes, may be omitted from a given iteration (i.e., skipping the computations for that variable node, or nodes). By processing only a partial subset of the entire variable nodes in one or more of the iterations, the decoding latency and power consumption reduce considerably.

Consider an embodiment of a decoder that includes logic circuitry and multiple Variable-Node Circuits (VNCs). The VNCs are configured to individually hold one or more variables of an Error Correction Code (ECC) that is representable by a plurality of check equations defined over the variables. The logic circuitry is configured to receive for decoding a code word that was encoded using the ECC, the code word includes multiple variables having m-bit values, m being a positive integer, and to further receive multiple reliability levels assigned respectively to the variables of the received code word. The logic circuitry is configured to decode the received code word by applying to the code word a sequence of iterations, including deciding in a given iteration in the sequence whether a given VNC among the VNCs is to be processed or skipped in that iteration, depending on the reliability levels assigned to the variables associated with the given VNC, and, when the given VNC is selected for processing, to make a decision whether or not to update one or more of the values of the variables associated with the given VNC, and to apply the decision by the given VNC.

In some embodiments, the logic circuitry makes the decisions of processing or skipping VNCs during the iterations. In other embodiments, prior to performing the sequence of iterations, the logic circuitry derives, based at least on the reliability levels, a schedule specifying which of the VNCs are to be processed and which of the VNCs are to be skipped in one or more of the iterations. The logic circuitry then decides to process or skip the VNCs during performing the iterations based on the derived schedule.

The reliability levels that are assigned to the variables belong to a set of two or more predefined reliability values. In making the processing or skip decisions, the logic circuitry determines counts of the variables in the given VNC that are assigned respectively to the two or more reliability values and decides to process or skip the given VNC based at least on the counts. For example, in an embodiment, the logic circuitry decides to process or skip the given VNC depending at least on a number of the variables in the given VNC that are assigned to a lowest reliability value among the predefined reliability values.

In some embodiments, the predefined reliability values have binary values having a High Reliability (HR) value and a Low Reliability (LR) value. In such embodiments, it may be advantageous to skip a VNC having a small number of variables having the LR value. In such embodiments, the logic circuitry holds, for a given iteration among the iterations, predefined first and second skipping thresholds associated respectively with the LR and the HR values. The logic circuitry evaluates a number of the variables in the VNC assigned to the LR value and decides to skip the given VNC based on the first skipping threshold when the evaluated number is higher than a predefined threshold number, or based on the second skipping threshold when the evaluated number is lower than or equal to the predefined threshold number. The skipping thresholds may be configured to same values as corresponding bit-flipping thresholds that are used in deciding on flipping variables.

For a given VNC selected to be processed, the logic circuitry decides whether to flip the binary value of each variable in the given VNC. To this end, the logic circuitry calculates a score value for a given variable of the given VNC, based at least on the reliability level assigned to the given variable, the score value being indicative of a confidence level of the given variable holding a correct binary value corresponding to a successfully decoded version of the code word. The logic circuitry makes the decision of whether to flip the given variable based on the score value.

In an example embodiment, in making bit-flipping decisions, the logic circuitry selects a bit-flipping threshold from among multiple predefined bit-flipping thresholds associated respectively with the predefined reliability values, depending on the reliability level assigned to the given variable, and decides to flip the binary value of the given variable when the score value calculated for the given variable exceeds the selected bit-flipping threshold.

The logic circuitry may calculate score values of respective variables in various ways. For example, in an embodiment, the logic circuitry calculates the score value for the given variable based on (i) a number of the check equations of the ECC in which the given variable participates and that are unsatisfied, (ii) an indication of whether the binary value of the given variable differs from a corresponding binary value in the received code word, and (iii) a predefined weight value applied to the indication, the weight value depending on the reliability level assigned to the given variable.

The disclosed embodiments are applicable, for example, to an ECC comprising a Quasi-Cyclic (QC) Low-Density Parity-Check (LDPC) code. In such codes, the parity-check matrix includes multiple sub-matrices arranged in block-rows and block-columns, and the variables of the given VNC are (i) associated with a respective block-column of the parity-check matrix, and (ii) participate in a common number of check equations among the plurality of the check equations (the variables of a block-column have the same degree). In such embodiments, the entire VNC may be skipped in a given iteration, e.g., when the number of the variables in the VNC having the LR value is sufficiently small, as described above.

The logic circuitry may process the variables of a given VNC in any suitable order. For example, the logic circuitry makes the decisions of updating values of variables for at least two of the variables associated with the given VNC, in parallel to one another.

In some embodiments, the circuitry decides that the given VNC is to be skipped in a subsequence of one or more initial iterations of the sequence of iterations.

In the disclosed techniques an iterative decoder processes or skips variable nodes (or variable node circuits) over a sequence of iterations based on soft channel information. To this end, separate skipping thresholds are respectively specified for different reliability values. The iterative scheduling can be designed to skip certain variable nodes without any compromise to the overall decoding performance such as Bit Error Rate (BER) for given operating conditions, e.g., Signal to Noise Ratio (SNR). The disclosed techniques are advantageous in terms of implementation complexity, decoding latency and power consumption.

System Description

FIG. 1 is a block diagram that schematically illustrates a wireless communication system 20 that uses error correction coding, in accordance with an embodiment that is described herein. Wireless communication system 20 comprises a transmitter 24, which transmits data to a receiver 28. The transmitter accepts input data, encodes the data with a certain ECC, modulates the encoded data in accordance with a certain modulation scheme, converts the modulated digital signal to an analog signal, up-converts the analog signal to a suitable Radio frequency (RF), and transmits the RF signal toward the receiver using a transmitting antenna 32.

In receiver 28, a receiving antenna 36 receives the RF signal and provides it to a RF front end 40. The front end down-converts the RF signal to baseband or to a suitable Intermediate Frequency (IF), and digitizes the signal with a suitable Analog to Digital Converter (ADC—not shown in the figure). The digitized signal carrying the ECC-encoded data is demodulated by a modem 44, and the ECC is decoded by an ECC decoder 48. ECC decoder 48 is controlled by a processor 52. The structure and functionality of ECC decoder 48 are described in detail below. By decoding the ECC, decoder 48 reconstructs the data that was input to transmitter 24. The reconstructed data is provided as the receiver output.

Wireless communication system 20 may comprise, for example, a cellular system, a satellite system, a point-to-point communication link, or any other suitable communication system that employs ECC. Although the example of FIG. 1 refers to a wireless communication system, the techniques described herein can be used with wire-line communication systems, such as cable communication systems, as well.

Figure 2:
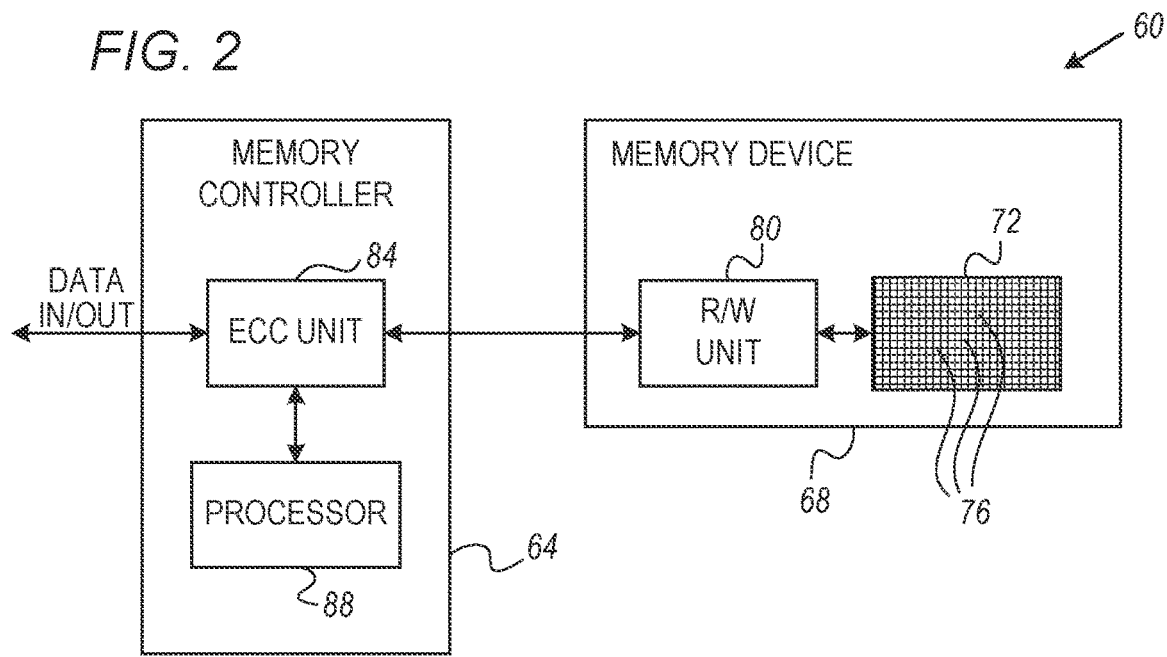
FIG. 2 is a block diagram that schematically illustrates a memory system that uses Error Correction Coding (ECC), in accordance with an embodiment that is described herein.

FIG. 2 is a block diagram that schematically illustrates a data storage system 60 that uses error correction coding, in accordance with an alternative embodiment that is described herein. Storage system 60 comprises a memory controller 64, which stores data in a memory device 68. The memory device comprises an array 72 comprising multiple memory cells 76. Array 72 may comprise any suitable type of volatile or non-volatile memory, such as, for example, Random Access Memory (RAM) or Flash memory. Alternatively, memory device 68 may comprise a magnetic storage device such as a Hard Disk Drive (HDD), or any other suitable storage medium. Storage system 60 can be used in various host systems and devices, such as in computing devices, cellular phones or other communication terminals, removable memory modules, Solid State Disks (SSD), digital cameras, music and other media players and/or any other system or device in which data is stored and retrieved.

Memory device 68 comprises a Read/Write (R/W) unit 80, which writes data values into memory cells 76 and reads data values from the memory cells. Memory controller 64 comprises an ECC unit 84, which encodes the data for storage with a certain ECC, and decodes the ECC of data that is retrieved from the memory cells. ECC unit 84 is controlled by a processor 88. The structure and functionality of ECC unit 84 are described in detail below. The ECC used in wireless communication system 20 and in storage system 60 may comprise, for example, a Low Density Parity Check (LDPC) code, as well as various other types of ECC.

The ECC decoding schemes described herein can be used in communication systems such as wireless communication system 20, as well as in data storage systems such as storage system 60. The description that follows applies to both communication applications and to storage applications, and refers generally to an ECC decoder. Any reference to the ECC decoder applies to ECC decoder 48 of wireless communication system 20, as well as to the decoder functionality of ECC unit 84 in storage system 60. Alternatively, the methods described herein can be carried out by any other suitable element in any other suitable system that involves ECC decoding.

Figure 3:
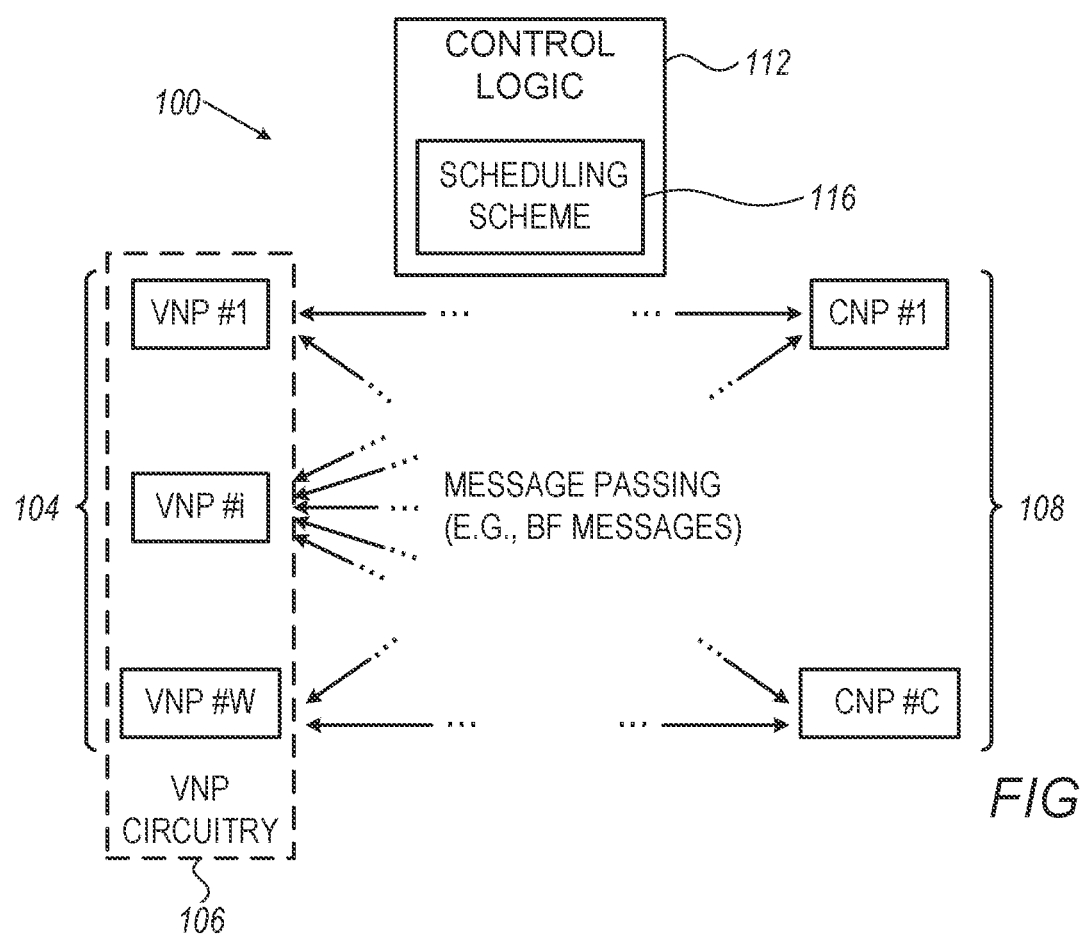
FIG. 3 is a block diagram that schematically illustrates an iterative LDPC decoder whose scheduling depends on soft channel information, in accordance with an embodiment that is described herein.

FIG. 3 is a block diagram that schematically illustrates an iterative LDPC decoder 100 whose scheduling depends on soft channel information, in accordance with an embodiment that is described herein. Decoder 100 can be used to implement ECC decoder 48 of FIG. 1 above, or ECC unit 84 of FIG. 2 above.

Decoder 100 accepts as input valid ECC code words, or other input that comprises corrupted code words (e.g., by noise) and therefore contain errors. In other words, the input to the decoder may not always comprise valid code words of the ECC. In the description that follows, the input to the decoder is also referred to as the channel output. In addition to the hard data input (bits of valid and/or invalid ECC code words), the channel also provides to decoder 100 soft channel information, in the form of reliability levels associated respectively with the bits of the code word. The values of the reliability levels belong to a set of two or more predefined reliability values. In some embodiments, the predefined reliability values are binary values having a High Reliability (HR) value and a Low Reliability (LR) value.

The ECC decoder decodes the input while attempting to correct erroneous bits, so as to reconstruct the data conveyed in the code words. In a typical implementation, each code word comprises on the order of several hundred to several thousand bits, although any other suitable code word size can be used.

The LDPC code in question is defined by a set of M check equations, which are defined over a set of V variables (e.g., bits for a binary LDPC code). Decoder 100 comprises a set of W Variable Node Processors (VNPs) 104 denoted VNP #1 ... VNP #W, and a set of C Check Node Processors (CNPs) 108 denoted CNP #1 ... CNP #C. Each variable may be associated with a respective VNP, and each check equation may be associated with a respective CNP.

VNPs 104 and CNPs 108 are connected by arcs (shown as arrows in the figure, in accordance with the structure of the underlying code. The VNP assigned to each variable (or variable node) is connected to the CNPs that are assigned to the check equations (or check nodes) in which that variable appears. Since the LDPC code is sparse (i.e., the code has a sparse parity-check matrix), each CNP is typically connected only to a small subset of the VNPs. In other words, only a small number of variables appear in each of the check equations. As long as the decoder has not yet converged to a valid code word, at least one check equation among the M check equations is still unsatisfied. The number of check equations in which a given variable appears (i.e., the number of check nodes connected to the respective variable node for that variable) is referred to as the degree of that variable, denoted "variable degree" (Vd).

LDPC codes may be classified as regular or irregular codes. The variables of a regular LDPC code all share the same degree. In irregular LDPC codes, at least two of the variables have different respective degrees. The decoding scheduling in the embodiments disclosed herein is demonstrated to be efficient for both regular and irregular LDPC codes.

The description that follows refers mainly to binary LDPC codes, in which case the variable nodes are also referred to as bit nodes. The disclosed techniques, however, are similarly applicable to non-binary codes, as well.

In some embodiments, decoder 100 carries out an iterative Message-Passing (MP) decoding scheme. In an example MP scheme, VNPs 104 are initialized with the respective bit values and with corresponding reliability levels of the channel output. The VNPs and CNPs exchange messages with one another over the arcs that connect them. Based on the messages received from the CNPs and on the channel output, VNPs may adapt their bit values. In some embodiments, the MP scheme comprises a Belief Propagation (BP) scheme, in which the messages exchanged between the VNPs and CNPs are referred to as BP messages. The messages from the CNPs to the VNPs are referred to herein as CNP messages, and the messages from the VNPs to the CNPs are referred to herein as VNP messages.

In the description that follows the terms "variable node" and "variable node circuit" (VNC) are used interchangeably.

Decoder 100 further comprises control logic 112 that manages and coordinates the operations carried out by the VNPs and CNPs. For example, among other tasks, control logic 112 manages the scheduling of the variable nodes and check nodes. In some embodiments, control logic 112 comprises a scheduling scheme 116 that defines scheduling for a sequence of decoding iterations. In some embodiments, scheduling scheme 116 specifies multiple predefined skipping thresholds and bit-flipping thresholds over a sequence of decoding iterations. For an irregular code, scheduling scheme 116 further specifies separate skipping thresholds and bit-flipping thresholds for the different Vd values. Moreover, for each iteration and Vd value, scheduling scheme 116 specifies respective separate skipping thresholds and bit-flipping thresholds for the different predefined reliability values. In some embodiments, the scheduling scheme does not specify skipping thresholds, in which case bit-flipping thresholds serve also as skipping thresholds.

In some embodiments, scheduling scheme 116 specifies weight factors for each iteration, Vd value, and predefined reliability value. The weight factors serve for calculating score values as will be described further below.

The bit-flipping thresholds are used for (i) deciding on whether to process or skip processing of variable nodes (or VNCs), and (ii) for deciding on bit flipping of variable nodes (or variables) being processed. In some embodiments, before starting the iterations, the decoder marks variables or groups of variables that may be skipped in one or more of the iterations. In such embodiments, the decoder derives, based at least on the reliability levels, a schedule (e.g., as part of scheduling scheme 116) specifying which of the variable nodes are to be processed and which of the variable nodes are to be skipped in one or more of the iterations, and decides to process or skip the variable nodes during performing the iterations based on the derived schedule.

Scheduling scheme 116 can be implemented in any suitable manner such as storing the scheduling information in a memory of any suitable storage technology. Such a memory may comprise a nonvolatile memory, e.g., a Read Only Memory (ROM), or a Flash memory. Alternatively, the memory that stores the scheduling scheme comprises a Random Access Memory (RAM), which is loaded with the scheduling scheme before decoding. In yet other embodiments, the scheduling scheme may be stored using hardware circuitry such as using registers, fuses, or any other suitable hardware elements.

ECC decoder 48 of FIG. 1, ECC unit 84 of FIG. 2 and ECC decoder 100 of FIG. 3 may be implemented in software, in hardware, or using a combination of hardware and software elements. In some embodiments, ECC decoder 48, ECC unit 84 and/or decoder 100 comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

In some embodiments, ECC decoder 48, ECC unit 84 and/or decoder 100 (including VNPs 104, CNPs 108, and control logic 112) are implemented in hardware, such as using one or more Application-Specific Integrated Circuits (ASICs), Field-Programmable gate Arrays (FPGAs) and/or discrete components. Some or all of the decoder functions may alternatively be implemented in software, or using a combination of software and hardware elements.

In the context of the present patent application and in the claims, the term "logic circuitry" collectively refers to VNPs 104, CNPs 108, and control logic 112 (including scheduling scheme 116.)

In some embodiments, VNPs 104 and CNPs 108 are implemented in hardware, in which case a variable node associated with a VNP comprises a variable-node circuit comprising a suitable storage element for storing the value and reliability level of the respective variable (or multiple variables), as well as logic for communicating with check nodes in relevant CNPs and for applying to the respective variable operations such as conditional bit-flipping.

Check and Variable Nodes Operation and Scheduling

In the description that follows, control logic 112 of decoder 100 manages the scheduling or scanning order of the variable and check nodes, using scheduling scheme 116. In the present example, an outer loop scans the variable nodes and an inner loop scans the check nodes connected to each scanned variable nodes. (This scheduling order is sometimes referred to as "serial V" or "column-layered".

In some embodiments, the variables of the ECC are partitioned into groups that are referred to as variable layers, or simply layers for brevity. A layer may comprise, for example, several tens of variables, e.g., 128 variables per layer. The variables in a given variable layer may be processed in any suitable order. For example, independent variables may be processed concurrently, or in any desired order, since they are independent of one another. The term "independent variables" in this context means that they do not appear together in any check equation. A group of variables is said to be independent if every pair of variables in the group is independent. The variable layers are typically processed sequentially, since variables in different layers may depend on one another.

In some embodiments, scheduling scheme 116 is defined at a layer granularity. In such embodiments, scheduling scheme 116 specifies scheduling information associated with all of the variables of the variable layer to which they belong. In such embodiments, the control logic skips together the entire variables of a layer.

In some embodiments, the iterative decoding process scans variable and check nodes, or groups thereof sequentially in some scheduling order. A full scan over the variable and check nodes is referred to herein as a decoding iteration, or simply "iteration" for brevity. An example of an iterative process of this sort is described in the paper by Cui et al., in "Efficient Decoder Design for High-Throughput LDPC decoding," IEEE Asia Pacific Conference on Circuits and Systems, November, 2008. Alternatively, any other suitable process can be used.

Based on the code structure and decoding scheduling, each CNP sends messages to its connected VNPs and receives messages from its connected VNPs. The message value sent from a given CNP to a given VNP comprises a predefined CNP function computed over the respective CNP state and the VNP messages received by that CNP.

CNPs 108 can use any suitable function to compute the message value to be sent to each of its connected VNPs. When decoder 100 is configured to extrinsic message passing decoding, the CNP function may comprise, for example the "product-sum" or "min-sum" function, or approximations thereof. When decoder 100 is configured to perform bit flipping decoding, the CNPs function comprises a parity-check sum function (also referred to as a syndrome calculation function), which is related to the check equations. When decoder 100 is configured to a-posteriori message passing decoding, the CNP messages sent to a given variable node may be computed as a function of the messages received from that variable node.

Similarly, when the turn of each variable node arrives, the respective VNP receives messages from its connected CNPs and sends to these CNPs updated messages. The message value sent from a given VNP to a given CNP comprises a predefined VNP function computed over the incoming CNP messages and the VNP state. The set of messages typically comprises the most updated messages received in the given VNP from the CNPs other than the given CNP, e.g., during the most recent decoding iteration.

VNPs 104 can use any suitable VNP function for calculating the message value to be sent to its connected CNPs. In some embodiments, decoder 100 comprises an extrinsic message passing decoder, and the VNP function comprises, for example, the summation of all the incoming messages sent from the target check node. In alternative embodiments, decoder 100 comprises an a-posteriori message passing decoder, and the VNP function computes, for example, the summation of all the incoming messages. In further alternative embodiments, decoder 100 comprises a bit flipping decoder, and the VNP function comprises evaluating the VNP bit value, for example, by conditionally flipping the bit value based on a score value associated with the variable. In some embodiments, the score value of a variable depends on the number of the unsatisfied check equations in which the variable appears and on a predefined weight that depends on the reliability level assigned to the variable at the channel output. As will be described below, the maximal score value of a given variable may be used in deciding whether to process or skip processing this variable.

Upon receiving a new message from a given VNP, the CNP typically replaces the previous message received from this VNP, and re-evaluates its state to reflect the newly-received message. VNPs update similarly upon receiving the CNPs messages.

Iterative Decoding Using Channel Reliability Information

As noted above, the ECC decoder receives as a channel output a code word comprising multiple variables (e.g., bits), and corresponding reliability levels respectively assigned to these bits.

The values of the reliability levels belong to a predefined set of two or more reliability values. The description that follows refers, in some embodiments, to a set of two reliability values denoted a High Reliability (HR) value, and a Low Reliability (LR) value, respectively. Typically, the scheduling scheme controls the iterative decoding so that (binary) variables assigned to low reliability values are flipped with higher priority than variables assigned to high reliability values, e.g., in a subsequence of one or more early iterations.

In some embodiments, the processing of a variable having a binary value involves calculating for the variable a score value. The decoder checks a flipping condition by comparing between the score value and a predefined bit-flipping threshold (specified, e.g., in scheduling scheme 116). When the score value for a given variable exceeds the bit-flipping threshold, the decoder decides to flip the bit value of that variable. In general, a variable having a high score value is more likely to be flipped than a variable associated with a low score value.

In some embodiments, the score value of a variable depends on the number of check equations in the variable appears and that are unsatisfied, and on a penalty term that depends on whether the variable is flipped relative to the input, as given by:

$$\text{Score}(i) = \alpha \cdot BF(i) + Nu(i) \quad \text{Equation 1}$$

In Equation 1, 'i' denotes an index identifying the variable in the code word, $\alpha$ denotes a positive weight factor, $BF(i)$ is indicative of whether the current bit value differs from that in the received noisy code word, and $Nu(i)$ denotes the number of unsatisfied check equations for the variable. In some embodiments, $BF(i)$ equals '1' when the current bit value is different from that in the received noisy code word, and equals '0', otherwise.

In accordance with Equation 1, the score value increases with the number of unsatisfied check equations. The more unsatisfied check equations, the bit value may be considered less reliable, and therefore may be advantageously flipped. The score value in Equation 1 is increased by the value of the weight factor $\alpha$ when $BF(i)$ equals '1'. This means that when the variable is flipped relative to the input, but the number of unsatisfied check equations for the variable is withing an $\alpha$ distance below the flip threshold, the variable may be flipped back.

The score value in Equation 1 is limited to a maximal score value as described herein. When the variable has the same bit value as in the code word, the maximal score value equals the degree (Vd) of this variable, in accordance with the structure of the code. Otherwise, the maximal score value equals $\alpha+Vd$. It is noted that since before starting the decoding process no variables are yet flipped, the maximal scores assigned to variables equal the Vd values respectively associated with the variables. A maximal score set to Vd of a column also applies in a subsequence of multiple initial iterations in which processing a column is skipped. In some embodiments, upon detecting that the bit-flipping threshold (serving also as a skipping threshold) being used for a given variable exceeds the maximal score value, this variable cannot meet the flipping condition, and the decoder may skip processing this variable with no degradation in the decoding performance.

Figure 4:
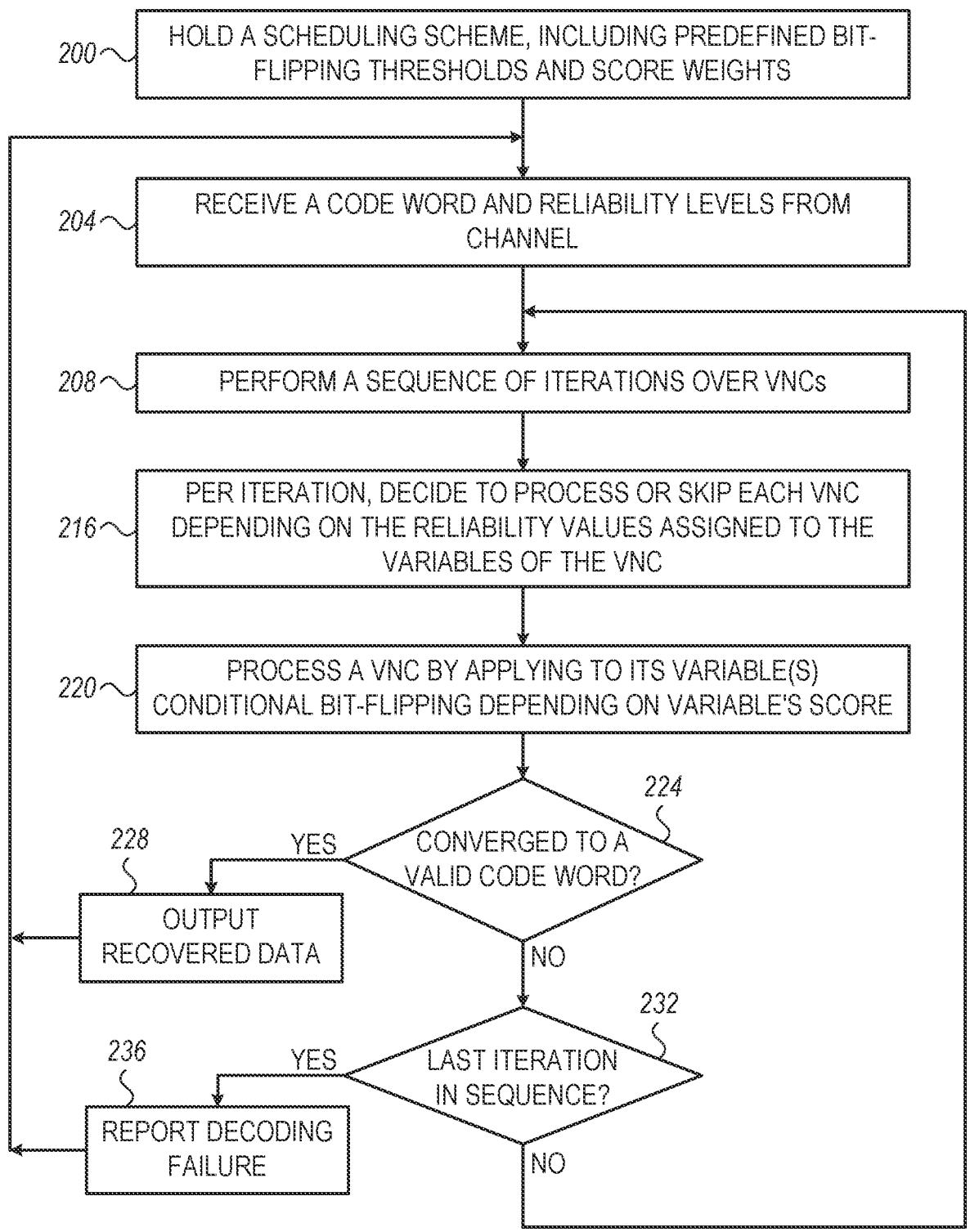
FIG. 4 is a flow chart that schematically illustrates a method for iterative decoding using channel reliability information, in accordance with an embodiment that is described herein.

FIG. 4 is a flow chart that schematically illustrates a method for iterative decoding using channel reliability information, in accordance with an embodiment that is described herein. The method is applicable for both variable nodes and variable layers. In FIG. 4, VNC denotes a variable node circuit handling one or more variables, such as processed by VNP 104, to which the scheduling has arrived. In some embodiments, the processing among the VNPs is performed in parallel. In the method of FIG. 4, the decision to process or skip the variables of a VNC is carried out by control logic 112, based on scheduling scheme 116. Alternatively, elements of decoder 100 other than control logic 112 may perform at least part of the operations carried out in the decoding process.

The method will be described as executed by decoder 100 of FIG. 3 above. In this example it is assumed that each VNP 104 handles one or more variables belonging to one or more VNCs. In some embodiments, the variables processed by a single VNP or VNC share a common degree. The method is described for binary codes but is applicable mutatis mutandis to non-binary codes as well. For example, the decision on flipping a binary variable based on score may be replaced with a suitable method for updating the non-binary variable in decoding a non-binary code.

The method begins with decoder 100 holding a scheduling scheme (e.g., 116) at a scheduling definition step 200. In some embodiments, the scheduling scheme is defined over a sequence of up to N iterations, wherein for each iteration $1 \le n \le N$, the scheduling scheme specifies predefined bit-flipping thresholds and score weight factors. The scheduling scheme specifies separate bit-flipping thresholds, and score weight factors per iteration and Vd value.

In the present example, the scheduling scheme also specifies separate bit-flipping thresholds and score weight factors per each of the predefined reliability values. For example, assuming two reliability values, (e.g., HR and LR values, as described above), the scheduling scheme specifies separate bit-flipping thresholds and score weight factors for each of the two reliability values.

In the present example, the specified bit-flipping thresholds are used also as skipping thresholds.

At a reception step 204, the decoder receives channel output including a code word to be decoded and reliability levels that are assigned to the bits of the code word. For example, the decoder receives the code word and the reliability levels from modem 44 in FIG. 1, or from R/W unit 80 of FIG. 2. In the description that follows it is assumed that the received code word is binary, i.e., comprises a vector of binary variables (bits). The code word received may contain one or more erroneous bits.

At an iteration loop step 208, control logic 112 performs a sequence of decoding iterations, up to the predefined number N of iterations. At a scanning step 216, in each iteration, the control logic decides whether to process or skip processing each of the VNCs.

In some embodiments, the control logic makes the process/skip decision based on the reliability levels assigned to the variables of the VNC. For example, the control logic determines counts of the variables in a given VNC that are assigned respectively to the two or more predefined reliability values and decides to process or skip the given VNC based at least on the counts. In an example embodiment, the control logic decides to process or skip the given VNC depending at least on a number of the variables in the given VNC that are assigned to a lowest reliability value among the predefined reliability values.

In some embodiments, to decide on processing or skipping a variable in a VNC, the control logic determines for the variable a maximal score value and compares between the maximal score value and the skipping threshold associated in the present iteration with the Vd value of the variable, and with the reliability level assigned to the variable. The control logic decides to skip the variable when the relevant threshold is higher than the maximal score value for this variable.

As noted above, in some embodiments, the predefined reliability values comprise binary values having a High Reliability (HR) value and a Low Reliability (LR) value. In such embodiments, the control logic holds, for a given iteration among the iterations, predefined first and second skipping thresholds associated respectively with the LR and the HR values. The control logic evaluates a number of the variables in the given VNC assigned to the LR value, and decides to skip the given VNC based on the first skipping threshold when the evaluated number is higher than a predefined threshold number, or based on the second skipping threshold of the present iteration when the evaluated number is lower than or equal to the predefined threshold number.

At a processing step 220, each VNC that is scheduled for processing at step 216, processes its variable(s) using a suitable bit-flipping method, using a respective VNP 104. For example, the VNC calculates a score value for a given variable, e.g., using Equation 1, with the weight factor associated with the current iteration index, Vd value of the variable, and the reliability level assigned to the variable. The score value being indicative of a confidence level of the given variable holding a correct binary value corresponding to a successfully decoded version of the code word.

In some embodiments, the control logic selects a bit-flipping threshold from among multiple predefined bit-flipping thresholds associated respectively with the predefined reliability values, depending on the reliability level assigned to the given variable, and makes the decision to update the value of the given variable by flipping the binary value of the given variable when the score value calculated for the given variable exceeds the selected bit-flipping threshold. When the VNC comprises multiple variables, the VNC may process these variables in any suitable order, e.g., sequentially. Alternatively, the VNC may process multiple variables in parallel to one another.

In terms of the VNPs and CNPs of FIG. 3, at step 220, VNP 104 receives CNP messages from its connected CNPs and calculates and sends respective VNP messages to its connected CNPs. In the present example it is assumed that each CNP message comprises an indication of whether the check equation that is associated with this CNP is satisfied. VNP 104 thus evaluates for the currently scanned VNC (and variable) the number of unsatisfied check equations among its associated check nodes, which the control logic uses in evaluating the score value. When VNP 104 processes a group of multiple VNCs, the VNP evaluates the number of unsatisfied check equations for each variable in each VNC in the group.

After processing all the VNCs for the current iteration, the control logic checks whether the decoding converged to a valid code word, at a convergence checking step 224. In an embodiment, the control logic detects convergence when all the check equations representing the ECC are satisfied. In response to detecting convergence, the decoder outputs the valid code word (or only the data part of the code word), at an output step 228, and loops back to step 204 to receive subsequent code words (and corresponding reliability levels) for decoding. Otherwise, the control logic checks whether the last iteration was processed, at a termination step 232. If the control logic detects at step 232 that all N iterations have been processed, the control logic outputs a decoding failure indication, at a failure reporting step 236, and loops back to step 204 to receive subsequent code words for decoding. Otherwise, the control logic loops back to step 208 to perform an additional decoding iteration.

Iterative Decoding with Skipping a Group of Variables

In some embodiments, the underlying ECC comprises a Quasi-Cyclic (QC) Low-Density Parity-Check (LDPC) code. A QC-LDPC code is characterized by a parity-check matrix H constructed from multiple L-by-L sub-matrices. Each of these sub-matrices comprises a zero matrix or a circulant matrix, which may be derived, for example, by shifting the rows or columns of an identity matrix cyclically. The parity-check matrix of a QC-LDPC code can be viewed as having multiple columns of L-by-L sub-matrices, wherein each such column corresponds to L bits of the code word. Since the L bits of a column are connected to the same check equations, these L bits share a common variable degree (Vd). In an irregular code, the Vd may vary across columns. In some embodiments, the number of bits per column equals 128, but other suitable numbers of bits per column can also be used.

Figure 5:
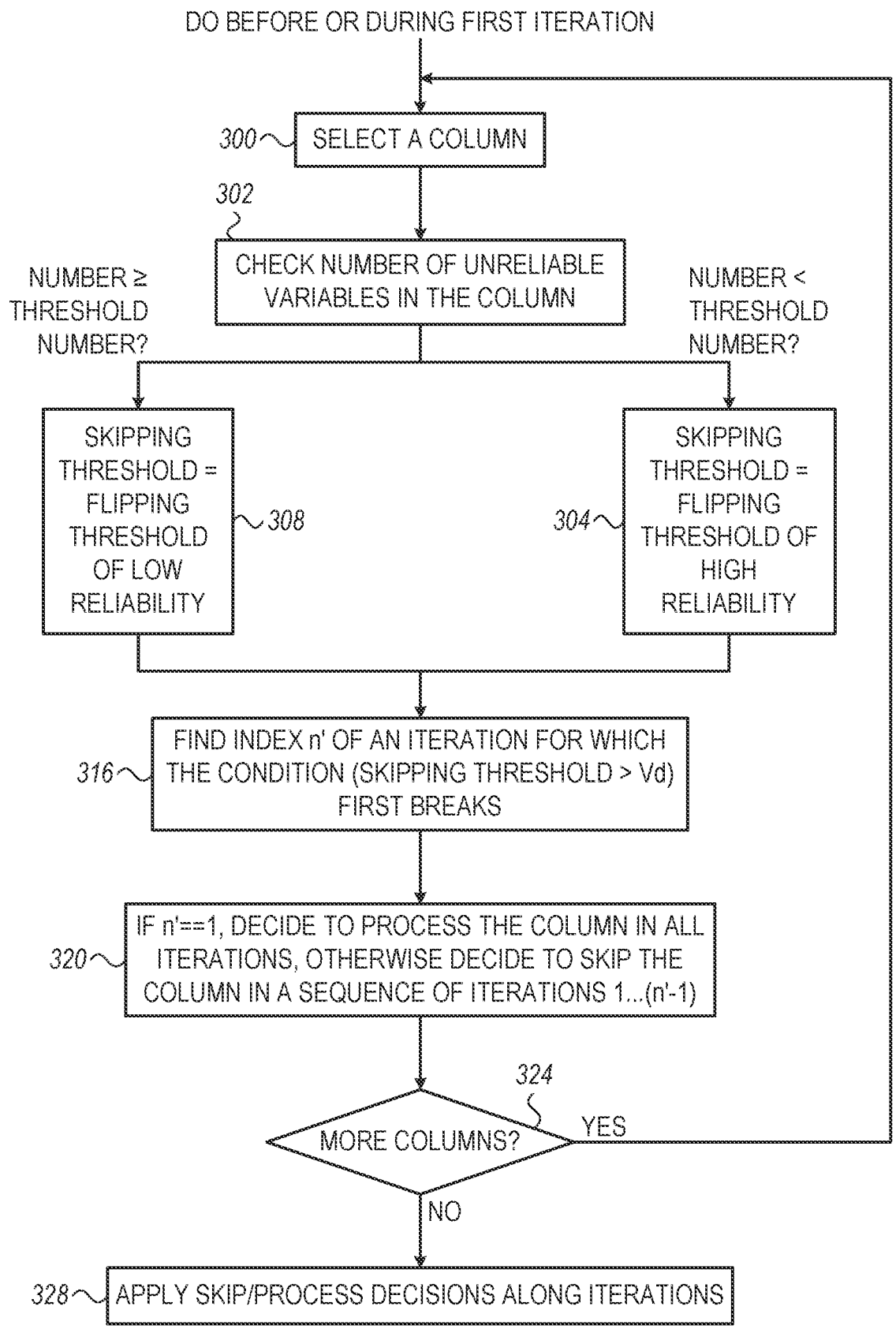
FIG. 5 is a flow chart that schematically illustrates a method for LDPC decoding with controlled skipping of columns depending on channel reliability information, in accordance with an embodiment that is described herein.

FIG. 5 is a flow chart that schematically illustrates a method for LDPC decoding with controlled skipping of columns depending on channel reliability information, in accordance with an embodiment that is described herein. The method of FIG. 5 is suitable, for example, in decoding QC LDPC codes, and may be performed before (or during) execution of the first iteration in the method of FIG. 4 above.

In the present example, it is assumed that the reliability levels of the variables have two possible values, e.g., a Low Reliability (LR) value and a High Reliability (HR) value. This assumption, however, is not mandatory, and reliability levels of more than two values can also be used.

The method begins with control logic 112 of decoder 100 selecting a given column of L variables from among the columns of the underlying parity-check matrix, at a column selection step 300. The control logic then checks the number of variables in the given column having the LR value, at a reliability checking step 300. A variable assigned to the LR (or HR) value is also referred to herein as an "unreliable variable" or "reliable variable," respectively. In general, when the number of variables assigned to the LR value is small, it may be advantageous to skip processing the entire column, even if some of these unreliable variables would otherwise be flipped.

Based on a comparison between the number of unreliable variables and a predefined threshold number, the control logic proceeds to a relevant skipping threshold determination step 304 or 308. The threshold number may be configured to any suitable positive number. For example, for L=128 variables per column, the threshold number may be configured to 5.

At step 304, the number of variables having the LR value is lower than the threshold number, and the control logic sets the skipping threshold to the value of the bit-flipping threshold associated with the LR value. At step 308, the number of variables having the LR value is equal to or higher than the threshold number, and the control logic sets the skipping threshold to the value of the bit-flipping threshold associated with the HR value. Steps 304 and 308 are performed over one or more (e.g., all) of the iterations 1 . . . N.

Following step 304 or 308, control logic 112 checks the skipping thresholds over the iterations to find an index n' of an iteration, along the sequence of iterations (1 . . . N), for which the condition (skipping threshold>Vd) first breaks, at a skip condition checking step 316, wherein different iterations may be associated with different respective skipping thresholds. At a decision-making step 320, the control logic makes skip/process decisions based on the index of the iteration found at step 316, as follows. When the index n' equals 1 (corresponding to the first iteration in the sequence, the control logic decides to process the given column across all the 1 . . . N iterations. Otherwise, the index n' is associated with some iteration other than the first iteration (1≤n'≤N), and the control logic decides to skip the given column in a subsequence of iterations whose indices fall in the range 1 . . . (n'−1).

At a loop termination step 324, the control logic checks whether there are any columns in the parity-check matrix that are not yet processed, and if so, loops back to step 300 to select another column to be processed. Otherwise, all columns have been processed, and the control logic proceeds to a decision application step 328 to apply the skip/process decisions of step 320 in performing the decoding iterations, e.g., as described in FIG. 4, and the method terminates.

In some embodiments, the decoder performs the method of FIG. 5 before starting the execution of the iterations, e.g., at step 200 of FIG. 4. In such embodiments, the decoder may include the skip/process decisions of step 320 as part of scheduling scheme 116. In another embodiment, for one or more (e.g., all) of the iterations, the decoder may mark columns of the parity-check matrix based on whether the number of unreliable variables in the column is below the threshold number (as done at step 302). In such embodiments the decoder gradually finds n' of step 316 and makes skip/process decisions of step 320 of the method of FIG. 5 during the iterations, based on the marked columns.

As noted above, the method of FIG. 5 may support reliability levels having more than just two values. In embodiments of this sort, steps 302, 304 and 308 may be modified so that the selection of a skipping threshold is based on multiple numbers of variables assigned to the respective reliability values.

Next are described considerations regarding the selection of various parameters that controls the iterative decoding, such as various thresholds and weight factors.

In general, any suitable pattern of bit-flipping thresholds, skipping thresholds and weight factors along the decoding iterations can be used. Patterns that result in shortest decoding time can be found, for example, by applying expositive search over multiple patterns.

In some embodiments, for selected Vd and reliability values, the bit-flipping thresholds and weight factors are selected to form respective non-increasing sequences along the decoding iterations. Consequently, larger numbers of variables may be flipped per iteration, as decoding advances along the sequence of iterations. Moreover, for a column associated with some Vd value, and assuming a non-increasing sequence of skipping thresholds, the condition (skipping threshold>Vd) is met in a sequence of Ns initial iterations and fails in all subsequent iterations. Therefore, the column can be safely skipped along the Ns initial iterations, without degrading the decoding performance. It is noted that Ns depends on the skipping threshold associated with the Vd value, and therefore columns of different Vd values may be skipped along different numbers of initial iterations.

In some embodiments, bit-flipping thresholds of the HR value are configured to be higher than respective bit-flipping thresholds of the LR value. In this case, unreliable variables are flipped with higher priority than reliable variables.

In some embodiments weight factors of the HR value are configured to be higher than respective weight factors of the LR value. Therefore, reliable variables get higher score values than unreliable variables. In this case, unreliable variables are flipped with higher priority than reliable variables.

Table 1 below provides an example assignment of bit-flipping thresholds along iterations, for a binary QC-LDPC code in which the variables in each column have a degree Vd=4 or Vd=8. The assignment of Table 1 may be used, for example, in implementing the methods of FIGS. 4 and 5 above.

TABLE 1

Assignment of bit-flipping thresholds to decoding iterations.

| Degree    | Vd4 | | Vd8 | |
|-----------|-----|-----|-----|-----|
| Iteration | LR  | HR  | LR  | HR  |
| 1 | Inf | Inf | 8 | Inf |
| 2 | Inf | Inf | 7 | Inf |
| 3 | 4   | Inf | 6 | Inf |
| 4 | 3   | Inf | 5 | Inf |
| 5 | 2   | Inf | 4 | 8   |
| 6 | 2   | Inf | 4 | 7   |
| 7 | 2   | 4   | 4 | 6   |

Table 1: Assignment of bit-flipping thresholds to decoding iterations.

The leftmost column in Table 1 depicts sequential iteration numbers in the range 1-7. Each of the other columns depicts bit-flipping thresholds corresponding to the iterations, Vd values and reliability values (LR and HR). The symbol "Inf" denotes any integer larger than the Vd value of the underlying column.

In general, when both the LR and HR bit-flipping thresholds are above Vd (Inf), no variables can be flipped. As described above, depending on the number of unreliable variables, the column may be conditionally flipped based on the HR bit-flipping threshold or based on the LR bit-flipping threshold.

In the example of Table 1, for Vd4, the condition (skipping threshold>Vd) breaks for the LR bit-flipping threshold at iteration 3 and breaks for the HR bit-flipping threshold at iteration 7. Therefore, a Vd4 column may be skipped during iterations 1-6 when the column contains a small number of unreliable variables, and may be skipped during iterations 1-2, otherwise. For Vd8, the condition (skipping threshold>Vd) never breaks for the LR bit-flipping threshold and breaks for the HR bit-flipping threshold at iteration 5. Therefore, a Vd8 column may be skipped during iterations 1-4 when the column contains a small number of unreliable variables, and not skipped at any iteration, otherwise.

The embodiments described above are given by way of example, and other suitable embodiments can also be used.

For example, although the embodiments above refer mainly to binary codes in which the variables have binary values (bits), the embodiments are similarly applicable to non-binary codes as well, as described herein. It is noted that during the decoding process, a variable may be updated by replacing its value with another value. In case of binary codes, a binary variable is updated by flipping its binary value.

In the method of FIG. 5, the skipping threshold for a given column is determined by classifying the number of variables assigned to the LR value into two nonoverlapping ranges determined by the threshold number. For example, consider a column of Z variables having a degree Vd, and let W denote the number of variables in the column having the LR value. In accordance with the method of FIG. 5, if W<Threshold number, e.g., if W<W1, the column is skipped from the first iteration up to some iteration denoted T1. Otherwise (W1≤W), the column is skipped from the first iteration up to an iteration denoted T2, wherein T2<T1, meaning that the T2 is earlier than T1 in the sequence of iterations.

In alternative embodiments, skipping the column may be based on classifying W into a number of nonoverlapping ranges larger than two (using multiple threshold numbers). For example, assuming three ranges specified by threshold numbers denoted W1 and W2 (W1<W2<Z), given by (W<W1), (W1≤W<W2) and (W2≤W): if W falls in the (W<W1) range, the column is skipped up to iteration T1, if W falls in the (W1≤W<W2) range, the column is skipped up to an iteration denoted T3, and if W falls in the (W25 W) range, the column is skipped up to iteration T2, wherein T2<T3<T1. Although in the example above W is classified into three ranges, in other embodiments W may be classified into any suitable number of nonoverlapping ranges larger than three.

In embodiments related to iterative decoding of a non-binary code, the variables of the code word carry m-bit values (also referred to as symbol values), with m being a positive integer larger than 1 (for binary codes m=1). In addition, the variables of the input code word are assigned respective reliability levels, as described above for binary codes.

During the iterative decoding, a variable-node receives massages containing updated symbol values from one or more check-nodes, and possibly updates the current symbol value in the variable-node, based on the received messages. In an example embodiment, the decoder determines an updated symbol value as the most prevalent symbol value among the received messages, and updates the variable by replacing the current symbol value with the updated symbol value when the number of messages containing the updated symbol value exceeds a specified threshold number. Separate threshold numbers may be assigned to different iterations, Vd values and reliability levels.

In some embodiments, the decoder decides whether to process or skip a column of the non-binary variables, depending on the reliability levels assigned to the variables associated with that column, e.g., as described in the method FIG. 5.

It will be appreciated that the embodiments described above are cited by way of example, and that the following claims are not limited to what has been particularly shown and described hereinabove. Rather, the scope includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A decoder, comprising:
multiple Variable-Node Circuits (VNCs), configured to individually hold one or more variables of an Error Correction Code (ECC) that is representable by a plurality of check equations defined over the variables, wherein a given VNC among the VNCs is associated with a plurality of the variables; and
logic circuitry, configured to:
receive for decoding a code word that was encoded using the ECC, the code word comprising multiple variables having m-bit values, m being a positive integer;
further receive multiple reliability levels assigned respectively to the variables of the received code word, wherein the reliability levels comprise predefined binary reliability values having a High Reliability (HR) value and a Low Reliability (LR) value;
decode the received code word by applying to the code word a sequence of iterations, including, in a given iteration in the sequence, holding for the given iteration predefined first and second skipping thresholds associated respectively with the LR and the HR values, evaluating a number of the variables associated with the given VNC that are assigned to the LR value, and deciding whether to skip or process the given VNC based on the first skipping threshold when the evaluated number is higher than a predefined threshold number, or based on the second skipping threshold when the evaluated number is lower than or equal to the predefined threshold number; and
when the given VNC is selected for processing, make a decision whether or not to update one or more of the values of the variables associated with the given VNC, and apply the decision by the given VNC.

2. The decoder according to claim 1, wherein, prior to performing the sequence of iterations, the logic circuitry is configured to derive, based at least on the reliability levels, a schedule specifying which of the VNCs are to be processed and which of the VNCs are to be skipped in one or more of the iterations, and to decide to process or skip the VNCs during performing the iterations based on the derived schedule.

3. The decoder according to claim 1, wherein the variables of the code word have binary values, and wherein the logic circuitry is configured to calculate a score value for a given variable of the given VNC, based at least on the reliability level assigned to the given variable, the score value being indicative of a confidence level of the given variable holding a correct binary value corresponding to a successfully decoded version of the code word, and to make the decision for the given variable based on the score value.

4. The decoder according to claim 3, wherein the logic circuitry is configured to select a bit-flipping threshold from among multiple predefined bit-flipping thresholds associated respectively with the predefined reliability values, depending on the reliability level assigned to the given variable, and to make the decision to update the value of the given variable by flipping the binary value of the given variable when the score value calculated for the given variable exceeds the selected bit-flipping threshold.

5. The decoder according to claim 3, wherein the logic circuitry is configured to calculate the score value for the given variable based on (i) a number of the check equations of the ECC in which the given variable participates and that are unsatisfied, (ii) an indication of whether the binary value of the given variable differs from a corresponding binary value in the received code word, and (iii) a predefined weight value applied to the indication, the weight value depending on the reliability level assigned to the given variable.

6. The decoder according to claim 1, wherein the ECC comprising a Low-Density Parity-Check (LDPC) code, in which a parity-check matrix comprises multiple sub-matrices arranged in block-rows and block-columns, and wherein the plurality of the variables of the given VNC are (i) associated with a respective block-column of the parity-check matrix, and (ii) participate in a common number of check equations among the plurality of the check equations.

7. The decoder according to claim 1, wherein the logic circuitry is configured to make the decision for at least two of the plurality of the variables associated with the given VNC, in parallel to one another.

8. The decoder according to claim 1, wherein the circuitry is configured to decide that the given VNC is to be skipped in a subsequence of one or more initial iterations of the sequence of iterations.

9. A method for decoding, comprising:
in a decoder comprising multiple Variable-Node Circuits (VNCs) that individually hold one or more variables of an Error Correction Code (ECC) that is representable by a plurality of check equations defined over the variables, wherein a given VNC among the VNCs is associated with a plurality of the variables,
receiving for decoding a code word that was encoded using the ECC, the code word comprising multiple variables having m-bit values, m being a positive integer;
further receiving multiple reliability levels assigned respectively to the variables of the received code word, wherein values of the reliability levels comprise predefined binary reliability values having a High Reliability (HR) value and a Low Reliability (LR) value;
decoding the received code word by applying to the code word a sequence of iterations, including, in a given iteration in the sequence, holding for the given iteration predefined first and second skipping thresholds associated respectively with the LR and the HR values, evaluating a number of the variables associated with the given VNC that are assigned to the LR value, and deciding whether to skip or process the given VNC based on the first skipping threshold when the evaluated number is higher than a predefined threshold number, or based on the second skipping threshold when the evaluated number is lower than or equal to the predefined threshold number; and
when the given VNC is selected for processing, making a decision whether or not to update one or more of the values of the variables associated with the given VNC, and applying the decision by the given VNC.

10. The method according to claim 9, and comprising, prior to performing the sequence of iterations, deriving, based at least on the reliability levels, a schedule specifying which of the VNCs are to be processed and which of the VNCs are to be skipped in one or more of the iterations, and deciding to process or skip the VNCs during performing the iterations based on the derived schedule.

11. The method according to claim 9, wherein the variables of the code word have binary values, and comprising calculating a score value for a given variable of the given VNC, based at least on the reliability level assigned to the given variable, the score value being indicative of a confidence level of the given variable holding a correct binary value corresponding to a successfully decoded version of the code word, and making the decision for the given variable based on the score value.

12. The method according to claim 11, wherein making the decision comprises selecting a bit-flipping threshold from among multiple predefined bit-flipping thresholds associated respectively with the predefined reliability values, depending on the reliability level assigned to the given variable, and making the decision to update the value of the given variable by flipping the binary value of the given variable when the score value calculated for the given variable exceeds the selected bit-flipping threshold.

13. The method according to claim 11, wherein calculating the score value for the given variable comprises calculating the score value based on (i) a number of the check equations of the ECC in which the given variable participates and that are unsatisfied, (ii) an indication of whether the binary value of the given variable differs from a corresponding binary value in the received code word, and (iii) a predefined weight value applied to the indication, the weight value depending on the reliability level assigned to the given variable.

14. The method according to claim 9, wherein the ECC comprising a Low-Density Parity-Check (LDPC) code, in which a parity-check matrix comprises multiple sub-matrices arranged in block-rows and block-columns, and wherein the plurality of the variables of the given VNC are (i) associated with a respective block-column of the parity-check matrix, and (ii) participate in a common number of check equations among the plurality of the check equations.

15. The method according to claim 9, wherein making the decision comprises making the decision for at least two of the plurality of the variables associated with the given VNC, in parallel to one another.

16. The method according to claim 9, and comprising deciding that the given VNC is to be skipped in a subsequence of one or more initial iterations of the sequence of iterations.

17. A decoder, comprising:
multiple Variable-Node Circuits (VNCs), configured to individually hold one or more variables having binary values of an Error Correction Code (ECC) that is representable by a plurality of check equations defined over the variables, wherein a given VNC among the VNCs is associated with a plurality of the variables; and
logic circuitry, configured to:
receive for decoding a code word that was encoded using the ECC, the code word comprising multiple variables having m-bit values, m being a positive integer;
further receive multiple reliability levels assigned respectively to the variables of the received code word, wherein values of the reliability levels belong to a set of two or more predefined reliability values;
decode the received code word by applying to the code word a sequence of iterations, including, in a given iteration in the sequence, deciding whether to skip or process the given VNC based on how many of the variables associated with the given VNC have been assigned to a given reliability value; and when the given VNC is selected for processing, make a decision whether or not to update one or more of the values of the variables associated with the given VNC, and apply the decision by the given VNC, wherein, in making the decision, the logic circuitry is configured to calculate a score value for a given variable of the given VNC, based on (i) a number of the check equations of the ECC in which the given variable participates and that are unsatisfied, (ii) an indication of whether the binary value of the given variable differs from a corresponding binary value in the received code word, and (iii) a predefined weight value applied to the indication, the weight value depending on the reliability level assigned to the given variable, the score value being indicative of a confidence level of the given variable holding a correct binary value corresponding to a successfully decoded version of the code word, and to make the decision for the given variable based on the score value.

18. A method for decoding, comprising:

in a decoder comprising multiple Variable-Node Circuits (VNCs) that individually hold one or more variables having binary values of an Error Correction Code (ECC) that is representable by a plurality of check equations defined over the variables, wherein a given VNC among the VNCs is associated with a plurality of the variables, receiving for decoding a code word that was encoded using the ECC, the code word comprising multiple variables having m-bit values, m being a positive integer;

further receiving multiple reliability levels assigned respectively to the variables of the received code word, wherein values of the reliability levels belong to a set of two or more predefined reliability values;

decoding the received code word by applying to the code word a sequence of iterations, including, in a given iteration in the sequence, deciding whether to skip or process the given VNC based on how many of the variables associated with the given VNC have been assigned to a given reliability value; and when the given VNC is selected for processing, making a decision whether or not to update one or more of the values of the variables associated with the given VNC, and applying the decision by the given VNC, wherein making the decision comprises calculating a score value for a given variable of the given VNC, based on (i) a number of the check equations of the ECC in which the given variable participates and that are unsatisfied, (ii) an indication of whether the binary value of the given variable differs from a corresponding binary value in the received code word, and (iii) a predefined weight value applied to the indication, the weight value depending on the reliability level assigned to the given variable, the score value being indicative of a confidence level of the given variable holding a correct binary value corresponding to a successfully decoded version of the code word, and making the decision for the given variable based on the score value.

\* \* \* \* \*